United States Patent [19]
Rumennik et al.

[11] Patent Number: 5,323,044
[45] Date of Patent: Jun. 21, 1994

[54] BI-DIRECTIONAL MOSFET SWITCH

[75] Inventors: Vladimir Rumennik, Los Altos; Wayne B. Grabowski, Mountain View, both of Calif.

[73] Assignee: Power Integrations, Inc., Mountain View, Calif.

[21] Appl. No.: 955,682

[22] Filed: Oct. 2, 1992

[51] Int. Cl.$^5$ .................. H01L 29/52; H01L 29/08
[52] U.S. Cl. ..................... 257/379; 257/390; 257/392; 257/395; 257/154; 257/165; 257/167
[58] Field of Search ............... 257/314, 343, 346, 368, 257/371, 373, 380, 387, 388, 393, 401, 122, 124, 285

[56] References Cited

U.S. PATENT DOCUMENTS 5,177,586 1/1993 Ishimura et al. .................. 257/368

OTHER PUBLICATIONS

Sze, S. M., Semiconductor Devices, Physics and Technology, Bell Laboratories Inc., 1985, pp. 34–38, 376–377.

J. Plummer and J. Meindl, *A Monolithic 200-V CMOS Analog Switch*, IEEE J. Solid-State Circuits, vol. SC-11, pp. 809–817, 1976.

R. Williams, L. Sevilla, E. Ruetz and J. Plummer, *A DI/JI-Compatible Monolithic High-Voltage Multiplexer*, IEEE Trans. Electron Devices, vol. ED-33, pp. 1977–1984, Dec. 1986.

B. Collins, *The Photo Voltaic Relay: A New Solid State Control Device*, An Application Note presented at the National Association of Relay Manufactures (NARM) Apr. 24, 1985.

Primary Examiner—William Mintel
Assistant Examiner—D. Hardy
Attorney, Agent, or Firm—Douglas L. Weller

[57] ABSTRACT

A bi-directional switch includes a well region of a first conductivity type placed within a substrate. A first region of second conductivity type is placed within the well. A second contact region of second conductivity type is placed within the well. A drift region of second conductivity is placed between the first contact and the second contact. The drift region is separated from the first contact by a first channel region and is separated from the second contact by a second channel region. A first gate region is placed over the first channel region and a second gate region over the second channel region.

10 Claims, 8 Drawing Sheets

BI-DIRECTIONAL MOSFET SWITCH

Background

The present invention concerns a bi-directional switch constructed of a high voltage metal-oxide-silicon field-effect transistor (MOSFET) whose source and drain are exposed to alternative voltage polarities.

Many applications require high-voltage MOSFETs to operate in an alternating current (AC) mode when the source and the drain of the MOSFETs are exposed to alternative voltage polarities. For examples, such applications include, but are not limited to, multi-channel multiplexing circuits and ultrasound drivers.

In the prior art, bi-directional high voltage semiconductor switches are constructed using, for example, two n-channel high voltage DMOS transistors back-to-back. See, for example, J. Plummer and J. Meindl, A Monolithic 200-V CMOS Analog Switch, *IEEE J. Solid-State Circuits*, vol. SC-11, pp. 809–817, 1976; or see, R. Williams, L. Sevilla, E. Ruetz and J. Plummer, A DI/JI-Compatible Monolithic High-Voltage Multiplexer, *IEEE Trans. Electron Devices*, vol. ED-33, pp. 1977–1984, December 1986. In such a configuration the sources of the transistors are connected while the drains become external electrodes. The bi-directional switch is controlled by applying voltage between the connected gates and connected sources.

The configuration descried by the two papers cited above requires a complex arrangement to drive the gate. The configuration also requires isolation of the DMOS transistors from the rest of the circuit using an expensive epitaxial base process. Therefore, such a configuration is only useful for applications in which voltage applied to the transistors is not greater than a few hundred volts.

An alternate way to drive the gate is used by the use of a photo-voltaic approach. See for example the BOSFET Photo Voltaic Relay described in *Microelectronic Relay Designer's Manual*, pp. D-13 through D-16. In such a bi-directional switch, the operating voltage is increased at the expense of the integration capability loss. A further disadvantage of such a bi-directional switch is that only one switch is placed on each integrated circuit. Additionally, the switch must be driven with a photo voltaic type gate drive.

One drawback to the prior art back-to-back transistor configurations, such as those described above, is the necessity to design the devices with a low drain to source resistance (Rds) when the switch is on. The reason for this is the presence of the so-called body diode inherently built into these devices. When the product of current and Rds (on) reaches 0.6 volt the body diode turns on and may destroy the bi-directional switch. To keep the body diode turned off at all times requires maintaining the voltage drop across the bi-directional switch below 0.6 volts. Clearly, since the device must operate at voltages below 0.6 volts at all current levels the Rds (on) has to be very low making either the die size very big or the current level very low.

SUMMARY OF THE INVENTION

In accordance with the preferred embodiment of the present invention, a bi-directional switch is presented. The bi-directional switch includes a well region of a first conductivity type placed within a substrate. A first contact region of second conductivity type is placed within the well. A second contact region of second conductivity type is placed within the well. A drift region of second conductivity is placed between the first contact and the second contact. The drift region is separated from the first contact by a first channel region and is separated from the second contact by a second channel region. A first gate region is placed over the first channel region and a second gate region over the second channel region.

In the preferred embodiment, a threshold voltage for a transistor grated by the first gate regions is less than 1.5 volts and a threshold voltage for a transistor grated by the second gate region is less than 1.5 volts. Also, placement of the first contact region and the first channel region within the well region is symmetrical with respect to placement of the second contact region and the second channel region.

Various circuitry is added to control potential of the well in the "off" state in the preferred embodiment of the present invention. A third contact region of second conductivity type is placed within the well. The third contact region is separated from the first contact region by a third channel region. A fourth contact region of second conductivity type is placed within the well. The fourth contact region is separated from the second contact region by a fourth channel region. A fifth contact region of first conductivity type is placed within the well. The fifth contact region is electrically coupled to the third contact region. A sixth contact region of first conductivity type is placed within the well. The sixth contact region is electrically coupled to the fourth contact region. A third gate region is placed over the third channel region. The third gate region is electrically coupled to the second contact region. A fourth gate region is placed over the fourth gate channel region. The fourth gate region is electrically coupled to the first contact region.

Additionally, circuitry is added to control potential of the well in the "on" state, in the preferred embodiment of the present invention. A seventh contact region of second conductivity type within the well. The seventh contact is electrically coupled to the fifth contact region. An eighth contact region of second conductivity type is placed within the well. The eighth contact is electrically coupled to the sixth contact region. A ninth contact region of second conductivity type is placed within the well. The ninth contact region is separated from the seventh contact region by a fifth channel region and the ninth contact is electrically coupled to the first contact region. A tenth contact region of second conductivity type is placed within the well. The tenth contact region is separated from the eighth contact region by a sixth channel region. The tenth contact is electrically coupled to the second contact region. A fifth gate region is placed over the fifth channel region. A sixth gate region is placed over the sixth channel region.

The present invention allows for construction of many high-voltage bi-directional switches on a single substrate. Additionally, the body diode effect within each bi-directional switch is completely suppressed. Additionally, no external power supply is required to operate the bi-directional switches. The resulting bi-directional switches also allow for higher operating current levels at smaller sizes than prior art devices.

DESCRIPTION OF THE PREFERRED EMBODIMENT

Figure 1:
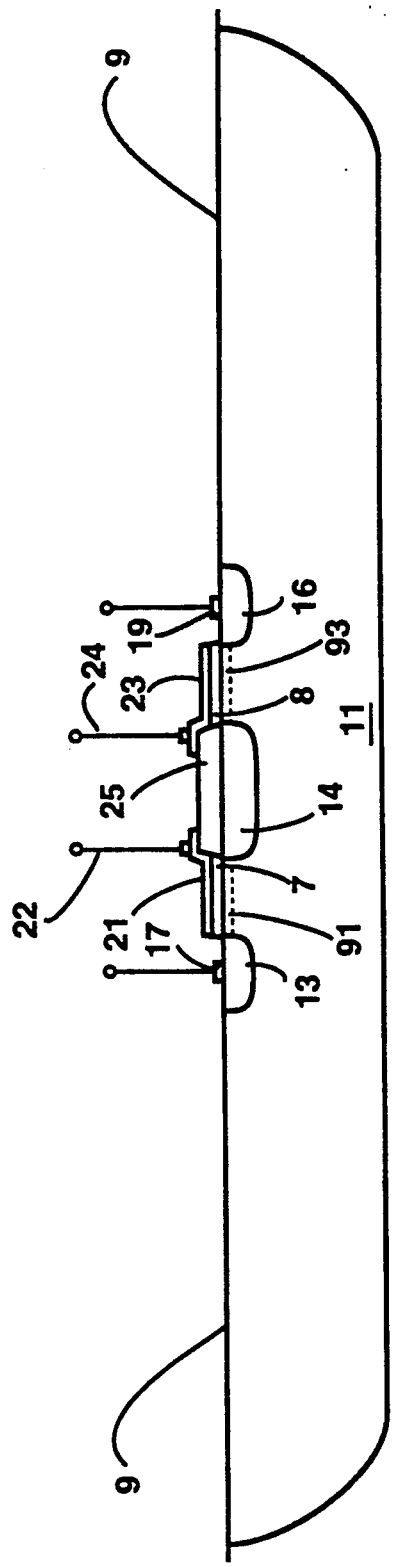
FIG. 1 shows a bi-directional MOSFET switch in accordance with a preferred embodiment of the present invention.

FIG. 1 shows a cross-sectional view of a bi-directional MOSFET switch formed on a semiconductor die. A substrate 10 of first conductivity type is, for example, made of $p^-$-type material doped with $1 \times 10^{14}$ atoms per cubic centimeter. A typical thickness of substrate 10 is 500 microns. A well 11 of material of second conductivity type is, for example, n-type material doped at $4 \times 10^{12}$ to $5 \times 10^{12}$ atoms per square centimeter. Well 11 extends a depth of, for example, 5 to 10 microns below a surface 9 of the semiconductor die. The doping levels and dimensions given here and below are for a device with a breakdown voltage of approximately 100 to 1000 volts.

Within well 11, a source contact region 13 of first conductivity type and a source contact region 16 of first conductivity type are, for example, $p^+$-type material doped at $2 \times 10^{15}$ atoms per square centimeter. Source contact region 13 and source contact region 16, for example, each extends 0.6 microns below surface 9 of the semiconductor die.

A source contact 17 is placed on surface 9 in electrical contact with source contact region 13. A source contact 19 is placed on surface 9 in electrical contact with source contact region 16.

A top region 14 of first conductivity type is, for example, a p-top region composed of p-type material doped at $2 \times 10^{12}$ atoms per square centimeter. Region 14 extends downward from surface 9 to a depth of, for example, 1 micron.

An insulating region 25 is placed on surface 9 over top region 14. Insulating region 25 is, for example, silicon dioxide. Insulating region 25 extends upward from surface 9 approximately 0.8 microns.

A gate region 21 is placed over a gate insulating region 7. A channel 91 within well 11 is immediately under gate insulating region 7. A gate region 23 is placed over a gate insulating region 8. A channel 93 within well 11 is immediately under gate insulating region 8. Gate region 21 and gate region 23 are, for example, $n^+$ polysilicon doped at 15 ohms per square. Gate insulating region 7 and gate insulating region 8 are, for example, composed of silicon dioxide and extend above surface 9 approximately 200 to 1000 Angstroms.

A gate electrode 22 is connected to gate region 21, as shown. A gate electrode 24 is connected to gate region 23, as shown.

In the bi-directional switch shown in FIG. 1, p-top region 14 can be viewed as two drains merged into one. This eliminates the need to have drain electrodes. Since only one drift region is used (i.e., p-top region 14) the Rds (on) resistance of the bi-directional switch is reduced significantly. Additionally, the space usually taken by the two drain electrodes is eliminated.

As can be seen from FIG. 1, the preferred embodiment of the present invention leads to the construction of an efficient high power bi-directional switch using a single high-voltage well 11. This allows for further area saving.

The bi-directional switch operates under the control of both gate regions 21 and gate regions 23. For both gate regions 21 and 23, when the gate to source voltage exceeds the threshold voltage (e.g. 0.7–1.5 volts), the bi-directional switch is turned on. Current flows from the highest potential electrode under the adjacent gate region, through p-top region 14, and finally under the second gate into the second electrode. When the gate to source voltage is below the threshold level the bi-directional switch is turned off.

A body diode is formed between source contact region 13 and well 11 and between source contact region 16 and well 11. To prevent the body diode from turning on, the potential of well 11 must be kept at, or near, the level of the high-potential electrode. The bi-directional switch may be designed so that the potential well 11 is automatically maintained at the highest potential in the bi-directional switch.

In the off-state the bi-directional switch does not conduct current, but must sustain high-voltages. The reduced surface electric field (RESURF) construction in the drift area (i.e., p-top region 14) of the bi-directional switch allows the bi-directional switch to hold off high voltages without junction breakdown. In the off-state, the bi-directional switch may exhibit a reduction in the breakdown voltage when the base (well 11) of the parasitic p-n-p transistor formed by source contacts 13 and 16, n-well 11 and substrate 10 is open (i.e., the so-called BVceo effect) if no measures are taken. Since the potential of well 11 is floating the built-in p-n-p transistors have an open base and the device drain breakdown voltage (BVD) is much lower than BVcbo (base shorted to emitter). The BVceo problem may be solved by connecting well 11 to the highest electrode potential through a p-channel MOSFET that is gated with the voltage from lowest electrode potential. The minor voltage offset (15 to 50 volts) formed due to the threshold voltage of the MOSFETs is insignificant in comparison with operating voltages (over 100 volts) for the bi-directional switch. A special transistor construction is required to sustain the opposite polarity voltage. These transistors are fabricated using field oxide devices with very thick gate oxides.

Figure 2:
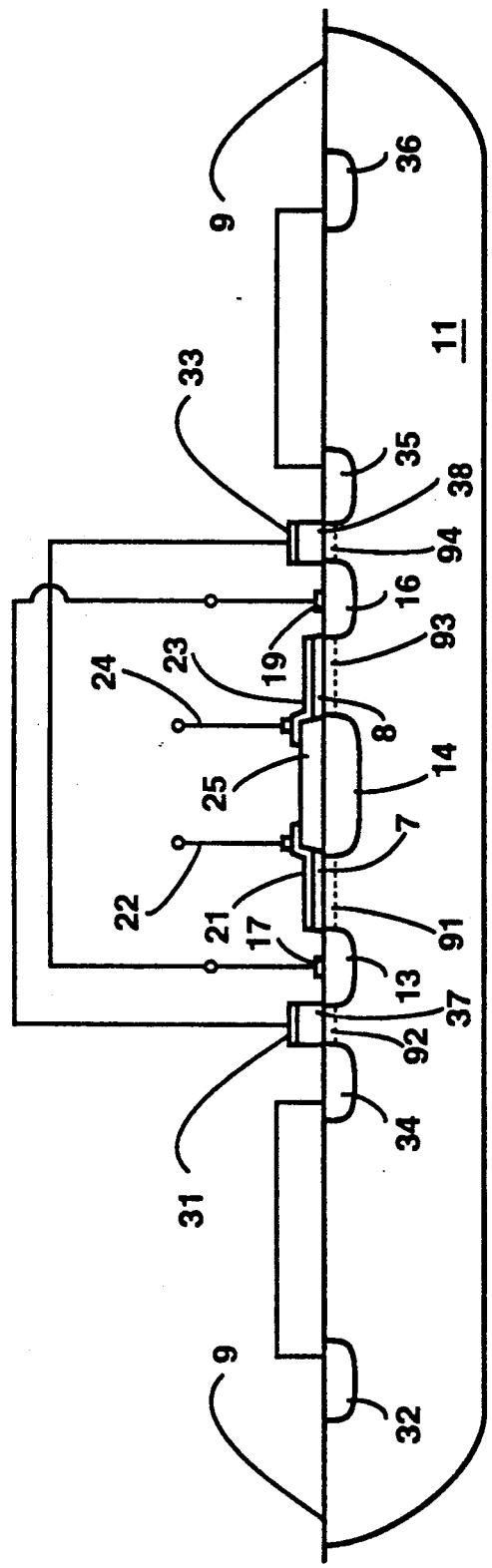
FIG. 2 shows the bi-directional MOSFET switch shown in FIG. 1 with a mechanism for controlling potential of the well in the "off" state, in accordance with a preferred embodiment of the present invention.

For example, a symmetrical implementation of the bi-directional switch is shown in FIG. 2. In FIG. 2, two cross-coupled field oxide MOSFETs are added. A source contact region 34 of first conductivity type and a source contact region 35 of first conductivity type are, for example, p+-type material doped at $2 \times 10^{15}$ atoms per square centimeter. Source contact region 34 and source contact region 35, for example, each extends 0.6 microns below surface 9 of the semiconductor die.

Source contact region 34 is electrically connected to well 11 through a contact region 32 of second conductivity type. Likewise, source contact region 35 is electrically connected to well 11 through a contact region 36 of second conductivity type. Contact region 32 and contact region 36 are, for example, n+-type material doped at $5 \times 10^{15}$ atoms per square centimeter and each extends 0.6 microns below surface 9 of the semiconductor die.

A gate region 31 is placed over a gate insulating region 37. A channel 92 within well 11 is immediately under gate insulating region 37. A gate region 33 is placed over a gate insulating region 38. A channel 94 within well 11 is immediately under gate insulating region 38. Gate region 31 and gate region 33 are, for example, n+ polysilicon doped at 15 ohms per square. Gate insulating region 37 and gate insulating region 38 are, for example, composed of silicon dioxide and extend above surface 9 approximately 8000 Angstroms. Gate region 31 is electrically connected to source contact 19 as shown. Likewise, gate region 33 is electrically connected to source contact 17 as shown.

When the bi-directional switch is turned on, the voltage at gate region 31 and gate region 33 of the cross coupled field oxide MOSFETs shown in FIG. 2 may not be sufficient to turn these MOSFETs on. Therefore two additional of p-channel MOSFETs are added to allow electrical connection to well 11 when the bi-directional switch is in the on state.

Figure 3:
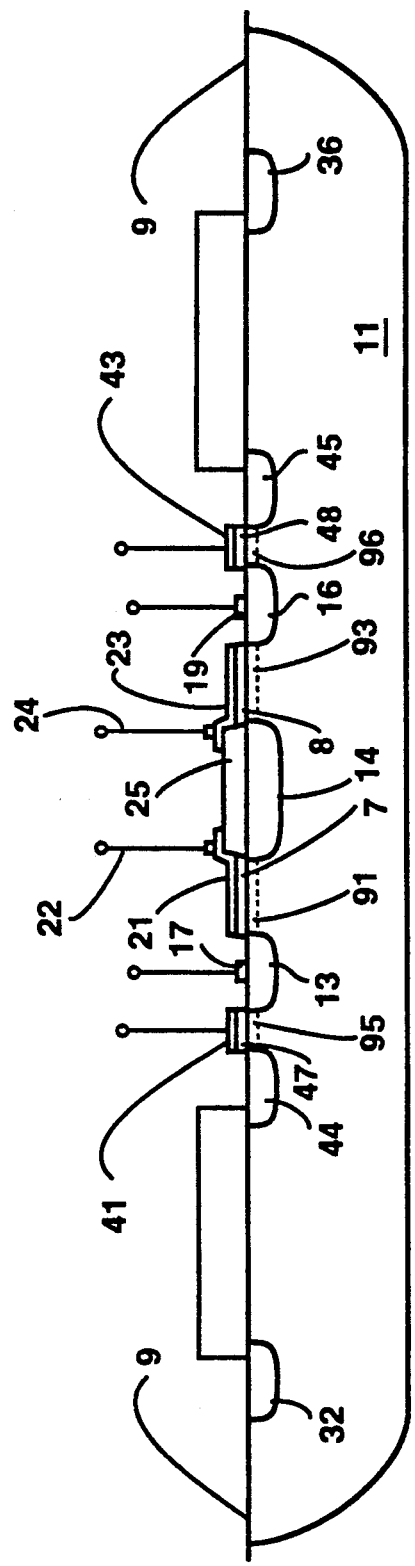
FIG. 3 shows the bi-directional MOSFET switch shown in FIG. 1 with a mechanism for controlling potential of the well in the "on" state, in accordance with a preferred embodiment of the present invention.

FIG. 3 shows a mechanism for controlling the potential of well 11 when the bi-directional switch is in the on state. A source contact region 44 of first conductivity type and a source contact region 45 of first conductivity type are, for example, p+-type material doped at $2 \times 10^{15}$ atoms per square centimeter. Source contact region 44 and source contact region 45, for example, each extends 0.6 microns below surface 9 of the semiconductor die.

Source contact region 44 is electrically connected to well 11 through contact region 32. Likewise, source contact region 45 is electrically connected to well 11 through contact region 36.

A gate region 41 is placed over a gate insulating region 47. A channel 95 within well 11 is immediately under gate insulating region 47. A gate region 43 is placed over a gate insulating region 48. A channel 96 within well 11 is immediately under gate insulating region 48. Gate region 41 and gate region 43 are, for example, n+ polysilicon doped at 15 ohms per square. Gate insulating region 47 and gate insulating region 48 are, for example, composed of silicon dioxide and extend above surface 9 approximately 200 to 1000 Angstroms.

The additional MOSFETs shown added in FIG. 3 provide control of the potential of well 11 and allow for an alternative current path through well 11 in parallel with the current path through p-top region 14. This parallel path further reduces the device Rds (on) and effectively allows reduction of the size of the bi-directional switch.

Figure 4:
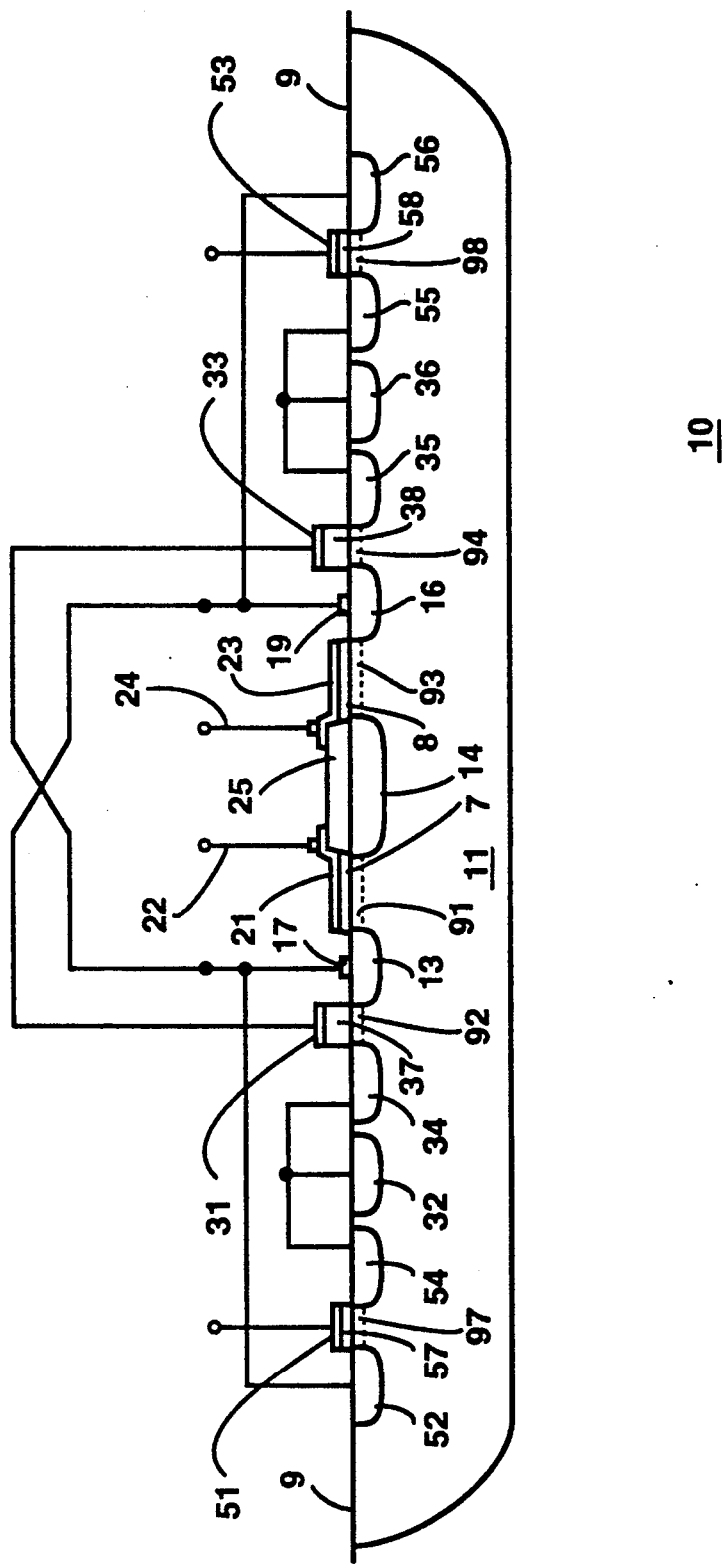
FIG. 4 shows the bi-directional MOSFET switch shown in FIG. 1 with the mechanisms shown in FIG. 2 and FIG. 3, in accordance with a preferred embodiment of the present invention.

FIG. 4 shows how the additional MOSFETs shown in FIG. 2 and FIG. 3 may be combined into a single embodiment. This may be done by starting with the embodiment shown in FIG. 2 and adding two p-channel MOSFETs. A source contact region 54 of first conductivity type and a source contact region 55 of first conductivity type are, for example, p+-type material doped at $2 \times 10^{15}$ atoms per square centimeter. Source contact region 54 and source contact region 55, for example, each extends 0.6 microns below surface 9 of the semiconductor die.

Source contact region 54 is electrically connected to well 11 through contact region 32. Likewise, source contact region 55 is electrically connected to well 11 through contact region 36.

A gate region 51 is placed over a gate insulating region 57. A channel 95 within well 11 is immediately under gate insulating region 57. A gate region 53 is placed over a gate insulating region 58. A channel 96 within well 11 is immediately under gate insulating region 58. Gate region 51 and gate region 53 are, for example, n+ polysilicon doped at 15 ohms per square. Gate insulating region 57 and gate insulating region 58 are, for example, composed of silicon dioxide and extend above surface 9 approximately 200 to 1000 Angstroms. A source contact region 52 of first conductivity type and a source contact region 56 of first conductivity type are added within well 11, and are respectively electrically connected to source contact region 13 and source contact region 16. For example, source contact region 52 and source contact region 56 are p+-type material doped at $2 \times 10^{15}$ atoms per square centimeter. Each extends 0.6 microns below surface 9 of the semiconductor die.

Figure 5:
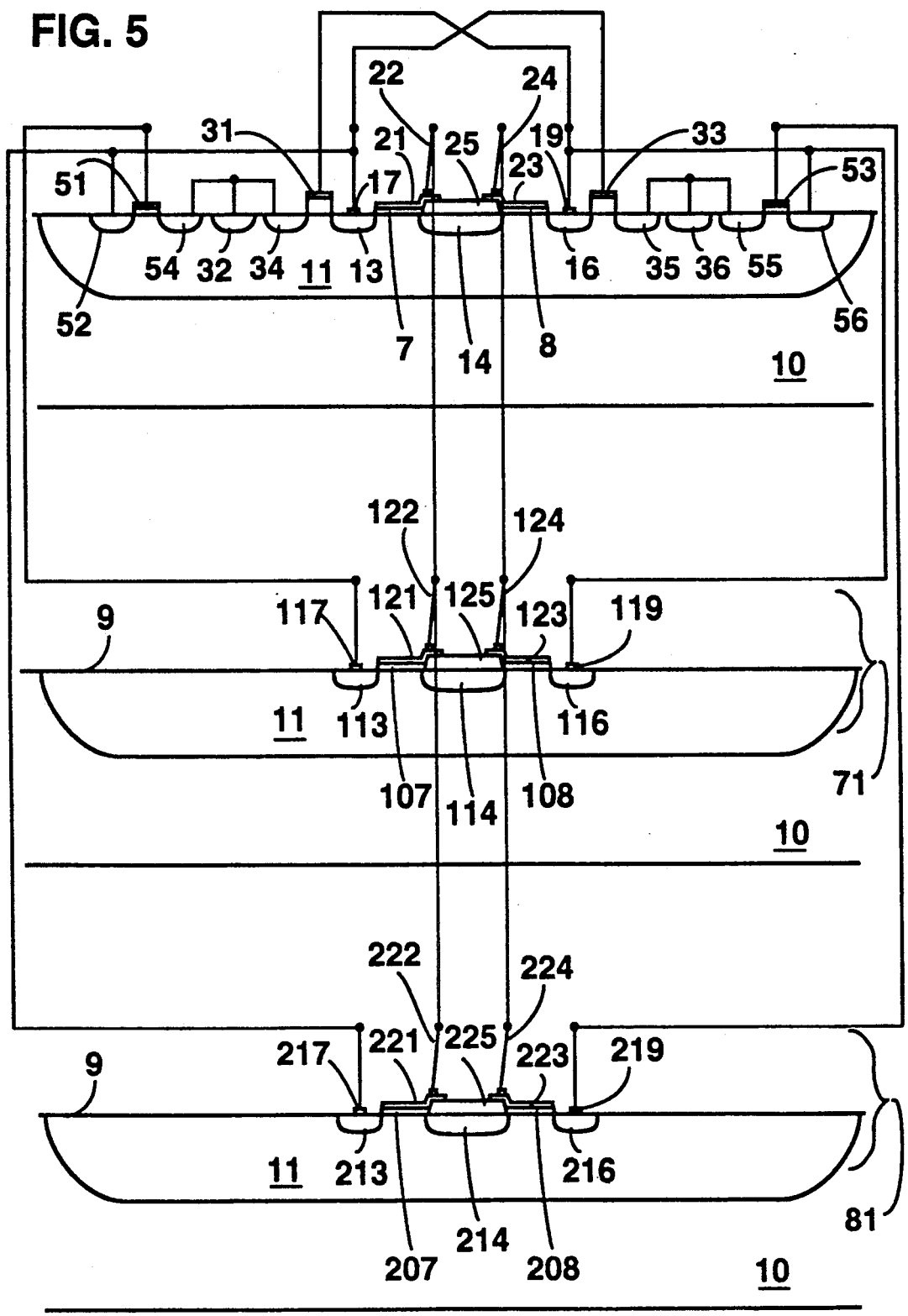
FIG. 5 shows the bi-directional MOSFET switch shown in FIG. 4 with two additional bi-directional MOSFETs used for providing control voltages in accordance with a preferred embodiment of the present invention.

FIG. 5 shows how a bi-directional switch 71 and a bi-directional switch 81 may be used to control the transistor gated by gate region 51 and the transistor gated by gate region 53. Bi-directional switch 71 and bi-directional switch 81 may be placed within well 11.

For bi-directional switch 71, a source contact region 113 of first conductivity type and a source contact region 116 of first conductivity type are, for example, p+-type material doped at $2 \times 10^{15}$ atoms per square centimeter. Source contact region 113 and source contact region 116, for example, each extends 0.6 microns below surface 9 of the semiconductor die.

A source contact 117 is placed on surface 9 in electrical contact with source contact region 113. A source contact 119 is placed on surface 9 in electrical contact with source contact region 116.

A top region 114 of first conductivity type is, for example, a p-top region composed of p-type material doped at $2 \times 10^{12}$ atoms per square centimeter. Region 114 extends downward from surface 9 to a depth of, for example 1 micron.

An insulating region 125 is placed on surface 9 over top region 114. Insulating region 125 is, for example, silicon dioxide. Insulating region 125 extends upward from surface 9 approximately 0.8 microns.

A gate region 121 is placed over a gate insulating region 107. A gate region 123 is placed over a gate insulating region 108. Gate region 121 and gate region 213 are, for example, n+ polysilicon doped at 15 ohms per square. Gate insulating region 107 and gate insulating region 108 are, for example, composed of silicon dioxide and extend above surface 9 approximately 200 t 1000 Angstroms.

A gate electrode 122 is connected to gate region 121, for example, at a portion of gate regions 121 which extends over insulating region 125, as shown. A gate electrode 124 is connected to gate region 123, for example, at a portion of gate regions 123 which extends over insulating region 125, as shown.

For bi-directional switch 81, a source contact region 213 of first conductivity type and a source contact region 216 of first conductivity type are, for example, p+-type material doped at $2 \times 10^{15}$ atoms per square centimeter. Source contact region 213 and source contact region 216, for example, each extends 0.6 microns below surface 9 of the semiconductor die.

A source contact 217 is placed on surface 9 in electrical contact with source contact region 213. A source contact 219 is placed on surface 9 in electrical contact with source contact region 216.

A top region 214 of first conductivity type is, for example, a p-top region composed of p-type material doped at $2 \times 10^{12}$ atoms per square centimeter. Region 214 extends downward from surface 9 to a depth of, for example 1 micron.

An insulating region 225 is placed on surface 9 over top region 214. Insulating region 225 is, for example, silicon dioxide. Insulating region 225 extends upward from surface 9 approximately 0.8 microns.

A gate region 221 is placed over a gate insulating region 207. A gate region 223 is placed over a gate insulating region 208. Gate region 221 and gate region 213 are, for example, n+ polysilicon doped at 15 ohms per square. Gate insulating region 207 and gate insulating region 208 are, for example, composed of silicon dioxide and extend above surface 9 approximately 200 to 1000 Angstroms.

A gate electrode 222 is connected to gate region 221, for example, at a portion of gate regions 221 which extends over insulating region 225, as shown. A gate electrode 224 is connected to gate region 223, for example, at a portion of gate regions 223 which extends over insulating region 225, as shown.

The configuration shown in FIG. 5 allows only one of the transistors controlled by gate regions 51 and 53 to turn on at a time. The transistor that turns on is the one that connects well 11 to the highest potential. Since there is no DC current flowing through bi-directional switch 71 or bi-directional switch 81, the body effect is not an issue. The pinch off voltage for well 11 is relatively small in comparison with the total applied voltage; therefore, bi-directional switch 71 and bi-directional switch 81 can be placed in well 11.

Figure 6:
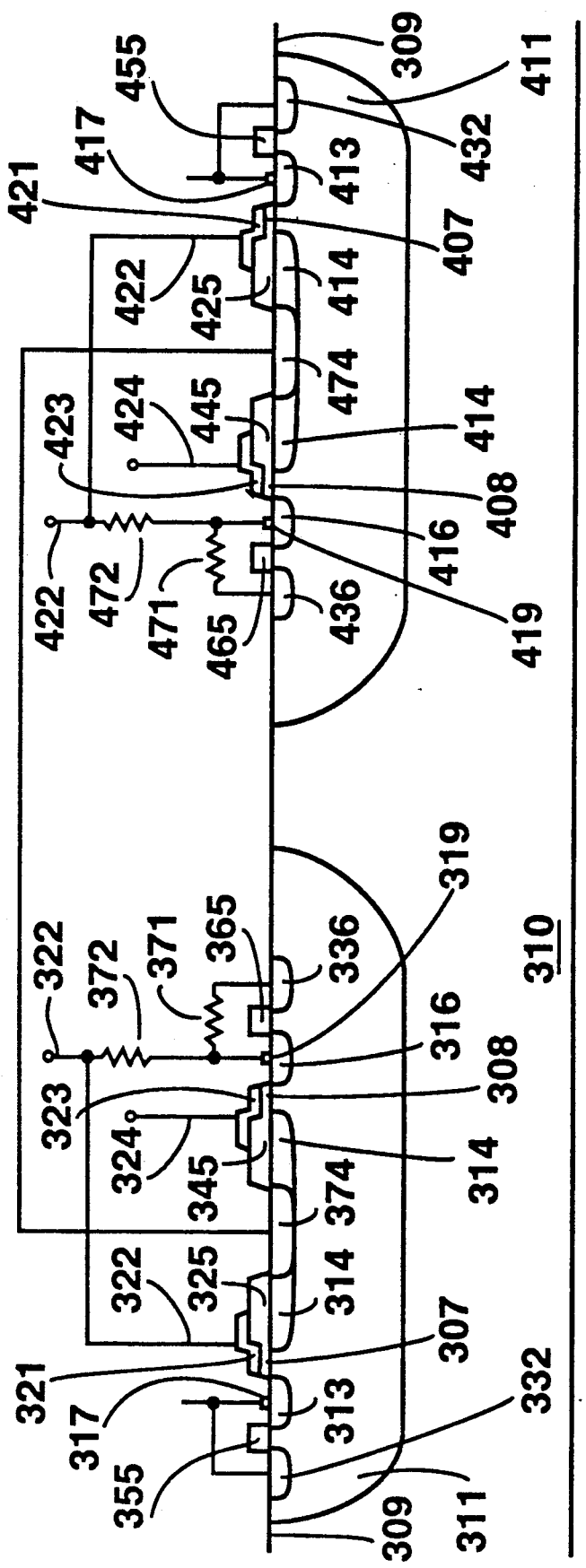
FIG. 6 shows a bi-directional MOSFET switch in accordance with an alternate preferred embodiment of the present invention.

FIG. 6 shows an alternate embodiment of the present invention in which two MOSFETs are located in separate wells. A substrate 310 of first conductivity type is, for example, made of p−-type material doped with $5 \times 10^{14}$ atoms per cubic centimeter. A typical depth of substrate 310 is 500 microns. A well 311 of material of second conductivity type is, for example, n-type material doped at $4 \times 10^{12}$ to $5 \times 12$ atoms per square centimeter. Well 311 extends a depth of, for example, 5 to 10 microns below a surface 309 of the semiconductor die. The doping levels and dimensions given here and below are for a device with a breakdown voltage of approximately 100 to 1000 volts.

In well 311, a source contact region 313 of first conductivity type and a source contact region 316 of first conductivity type are, for example, p+-type material doped at $2 \times 10^{15}$ atoms per square centimeter. Source contact region 313 and source contact region 316, for example, each extends 0.6 microns below surface 309 of the semiconductor die.

A source contact 317 is placed on surface 309 in electrical contact with source contact region 313. A source contact 319 is placed on surface 309 in electrical contact with source contact region 316.

A top region 314 of first conductivity type is, for example, a p-top region composed of p-type material doped at $2 \times 10^{12}$ atoms per square centimeter. Region 314 extends downward from surface 309 to a depth of, for example 1 micron.

An insulating region 325, an insulating region 345, an insulating region 355 and an insulating region 365 are placed on surface 309. Each of these insulating regions are, for example, silicon dioxide. The insulating regions extend upward from surface 309 approximately 0.8 microns.

A gate region 321 is placed over a gate insulating region 307. A gate region 323 is placed over a gate insulating region 308. Gate region 321 and gate region 323 are, for example, n+ polysilicon doped at 15 ohms per square. Gate insulating region 307 and gate insulating region 308 are, for example, composed of silicon dioxide and extend above surface 9 approximately 200 to 1000 Angstroms.

An electrode 322 is connected to gate region 321, for example, at a portion of gate regions 321 which extends over insulating region 325, as shown. A gate electrode 324 is connected to gate region 323, for example, at a portion of gate regions 323 which extends over insulating region 345, as shown.

Within top region 314, a drain contact region 374 is, for example, p+-type material doped at $2 \times 10^{15}$ atoms per square centimeter. Also, a contact region 332 and a contact region 336 are, for example, n+-type material doped at $5 \times 10^{15}$ atoms per square centimeter. Contact region 332 is electrically connected to source contact region 313 as shown. Source contact region 316 is electrically connected to electrode 322 through an impedance 372. Impedance 372 has a resistance of, for example, 100 ohms. Contact region 336 is electrically connected to source contact regions 316 through an impedance 371. Impedance 371 has a resistance of, for example, 100 kilohms.

A well 411 of material of second conductivity type is, for example, n-type material doped at $4 \times 10^{12}$ to $5 \times 10^{12}$ atoms per square centimeter. Well 411 extends a depth of, for example, 5 to 10 microns below surface 309 of the semiconductor die. The doping levels and dimensions given here and below are for a device with a breakdown voltage of approximately 100 to 1000 volts.

In well 411, a source contact region 413 of first conductivity type and a source contact region 416 of first conductivity type are, for example, p+-type material doped at $2 \times 10^{15}$ atoms per square centimeter. Source contact region 413 and source contact region 416, for example, each extends 0.6 microns below surface 309 of the semiconductor die.

A source contact 417 is placed on surface 309 in electrical contact with source contact region 413. A source contact 419 is placed on surface 309 in electrical contact with source contact region 416.

A top region 414 of first conductivity type is, for example, a p-top region composed of p-type material doped at $2 \times 10^{12}$ atoms per square centimeter. Region 414 extends downward from surface 309 to a depth of, for example 1 micron.

An insulating region 425, an insulating region 445, an insulating region 455 and an insulating region 465 are placed on surface 309. Each of these insulating regions are, for example, silicon dioxide. The insulating regions extend upward from surface 309 approximately 0.8 microns.

A gate region 421 is placed over a gate insulating region 407. A gate region 423 is placed over a gate insulating region 408. Gate region 421 and gate region 413 are, for example, n+ polysilicon doped at 15 ohms per square. Gate insulating region 407 and gate insulating region 408 are, for example, composed of silicon dioxide and extend above surface 9 approximately 200 to 1000 Angstroms.

An electrode 422 is connected to gate region 421, for example, at a portion of gate regions 421 which extends over insulating region 425, as shown. A gate electrode 424 is connected to gate region 423, for example, at a portion of gate regions 423 which extends over insulating region 445, as shown.

Within top region 414, a drain contact region 474 is, for example, p+-type material doped at $2 \times 10^{15}$ atoms per square centimeter. Also, a contact region 432 and a contact region 436 are, for example, n+-type material doped at $5 \times 10^{15}$ atoms per square centimeter. Contact region 432 is electrically connected to source contact region 413 as shown. Source contact region 416 is electrically connected to electrode 422 through an impedance 472. Impedance 472 has a resistance of, for example, 100 ohms. Contact region 436 is electrically connected to source contact regions 416 through an impedance 471. Impedance 471 has a resistance of, for example, 100 kilohms.

Figure 7:
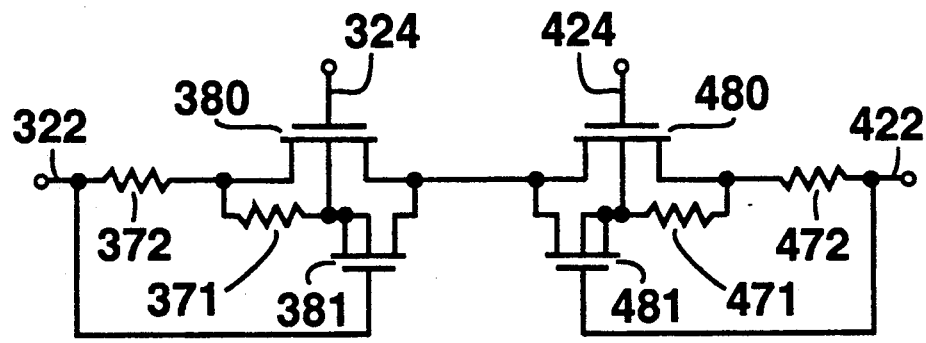
FIG. 7 shows a schematic diagram for the bi-directional MOSFET switch shown in FIG. 6, in accordance with the alternate preferred embodiment of the present invention.

FIG. 7 shows a schematic equivalent of the bi-directional switch shown in FIG. 6. In the schematic equivalent, a MOSFET 380 represents the MOSFET shown in FIG. 6 which is controlled by gate electrode 324. A MOSFET 381 represents the MOSFET shown in FIG. 6 which is controlled by electrode 322. A MOSFET 480 represents the MOSFET shown in FIG. 6 which is controlled by gate electrode 424. A MOSFET 481 represents the MOSFET shown in FIG. 6 which is controlled by electrode 422.

The bi-directional switch shown in FIG. 6 is not as area efficient as the previously described bi-directional switch, however, the bi-directional switch shown in FIG. 6 is relatively simple to implement. Electrode 322 and electrode 422 serve as the switched input/outputs of the bi-directional switch. Gate electrode 324 and gate electrode 424 serve to turn the bi-directional switch on and off. MOSFET 380 and MOSFET 480 are in separate wells and are connected through their drain electrodes. MOSFET 381 and MOSFET 481 automatically connect the n-wells to the highest potential electrode. When electrode 322 is at a lower potential than electrode 422 and the voltage across resistance 372 exceeds the threshold voltage of MOSFET 381, MOSFET 381 will turn on and connect well 311 to the drain potential (at drain contact region 374). Likewise, when electrode 422 is at a lower potential than electrode 322 and the voltage across impedance 472 exceeds the threshold voltage of MOSFET 481, MOSFET 481 will turn on and connect well 411 to the drain potential (at drain contact region 474). This action prevents the body diode from turning on. In the off-state the BVceo effect is suppressed by impedance 371 and impedance 471 respectively pulling the potential of well 311 and well 411 to the potential of electrode 322 and electrode 422.

Figure 8:
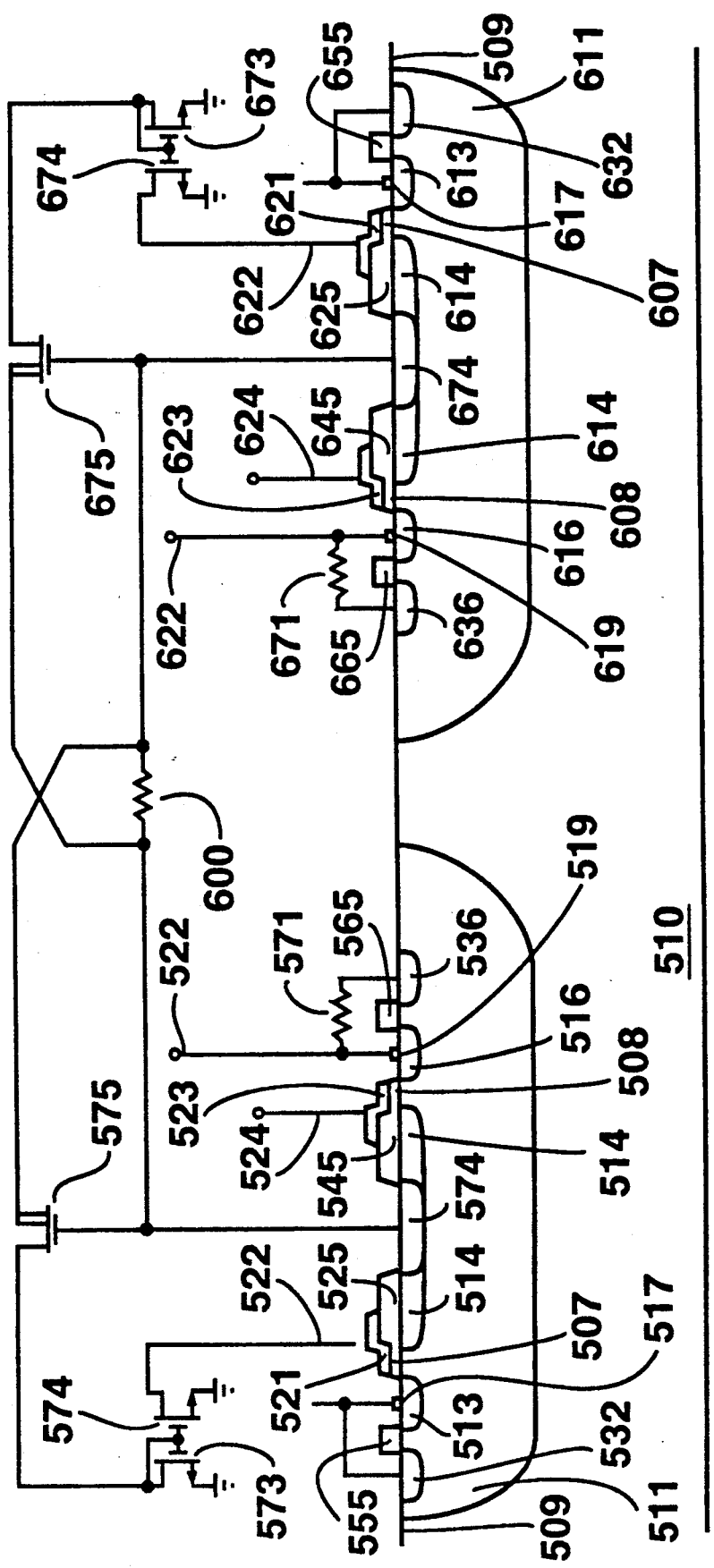
FIG. 8 shows a bi-directional MOSFET switch in accordance with another alternate preferred embodiment of the present invention.

FIG. 8 shows another embodiment of a bi-directional switch. A substrate 510 of first conductivity type is, for example, made of p−-type material doped with $5 \times 10^{14}$ atoms per cubic centimeter. A typical depth of substrate 510 is 500 microns. A well 511 of material of second conductivity type is, for example, n-type material doped at $4 \times 10^{12}$ to $5 \times 10^{12}$ atoms per square centimeter. Well 511 extends a depth of, for example, 5 to 10 microns below a surface 509 of the semiconductor die. The doping levels and dimensions given here and below are for a device with a breakdown voltage of approximately 100 to 1000 volts.

In well 511, a source contact region 513 of first conductivity type and a source contact region 516 of first conductivity type are, for example, p+-type material doped at $2 \times 10^{15}$ atoms per square centimeter. Source contact region 513 and source contact region 516, for example, each extends 0.6 microns below surface 509 of the semiconductor die.

A source contact 517 is placed on surface 509 in electrical contact with source contact region 513. A source contact 519 is placed on surface 509 in electrical contact with source contact region 516.

A top region 514 of first conductivity type is, for example, a p-top region composed of p-type material doped at $2 \times 10^{12}$ atoms per square centimeter. Region 514 extends downward from surface 509 to a depth of, for example 1 micron.

An insulating region 525, an insulating region 545, an insulating region 555 and an insulating region 565 are placed on surface 509. Each of these insulating regions are, for example, silicon dioxide. The insulating regions extend upward from surface 509 approximately 0.8 microns.

A gate region 521 is placed over a gate insulating region 507. A gate region 523 is placed over a gate insulating region 508. Gate region 521 and gate region 513 are, for example, n+ polysilicon doped at 15 ohms per square. Gate insulating region 507 and gate insulating region 508 are, for example, composed of silicon dioxide and extend above surface 509 approximately 200 to 1000 Angstroms.

A gate electrode 524 is connected to gate region 523, for example, at a portion of gate regions 523 which extends over insulating region 545, as shown. A gate electrode 522 is connected to gate region 521, for example, at a portion of gate regions 521 which extends over insulating region 525, as shown.

Within top region 514, a drain contact region 574 is, for example, p+-type material doped at $2 \times 10^{15}$ atoms per square centimeter. Also, a contact region 532 and a contact region 536 are, for example, n+-type material doped at $5 \times 10^{15}$ atoms per square centimeter. Contact region 532 is electrically connected to source contact region 513 as shown. Contact region 536 is electrically connected to an electrode 522 through an impedance 571. Impedance 571 has a resistance of, for example, 100 kilohms.

A well 611 of material of second conductivity type is, for example, n-type material doped at $4 \times 10^{12}$ to $5 \times 10^{12}$ atoms per square centimeter. Well 611 extends a depth of, for example, 5 to 10 microns below surface 509 of the semiconductor die. The doping levels and dimensions given here and below are for a device with a breakdown voltage of approximately 100 to 1000 volts.

In well 611, a source contact region 613 of first conductivity type and a source contact region 616 of first conductivity type are, for example, p+-type material doped at $2 \times 10^{15}$ atoms per square centimeter. Source contact region 613 and source contact region 616, for example, each extends 0.6 microns below surface 509 of the semiconductor die.

A source contact 617 is placed on surface 509 in electrical contact with source contact region 613. A source contact 619 is placed on surface 509 in electrical contact with source contact region 616.

A top region 614 of first conductivity type is, for example, a p-top region composed of p-type material doped at $2 \times 10^{12}$ atoms per square centimeter. Region 614 extends downward from surface 509 to a depth of, for example 1 micron.

An insulating region 625, an insulating region 645, an insulating region 655 and an insulating region 665 are placed on surface 509. Each of these insulating regions are, for example, silicon dioxide. The insulating regions extend upward from surface 509 approximately 0.8 microns.

A gate region 621 is placed over a gate insulating region 607. A gate region 623 is placed over a gate insulating region 608. Gate region 621 and gate region 613 are, for example, n+ polysilicon doped at 15 ohms per square. Gate insulating region 607 and gate insulating region 608 are, for example, composed of silicon dioxide and extend above surface 509 approximately 200 to 1000 Angstroms.

A gate electrode 624 is connected to gate region 623, for example, at a portion of gate region 623 which extends over insulating region 645, as shown. A gate electrode 622 is connected to gate region 621, for example, at a portion of gate regions 621 which extends over insulating region 625, as shown.

Within top region 614, a drain contact region 674 is, for example, p+-type material doped at $2 \times 10^{15}$ atoms per square centimeter. Also, a contact region 632 and a contact region 636 are, for example, n+-type material doped at $5 \times 10^{15}$ atoms per square centimeter. Contact region 632 is electrically connected to source contact region 613 as shown. Contact region 636 is electrically connected to an electrode 622 through an impedance 671. Impedance 671 has a resistance of, for example, 100 kilohms.

The bi-directional switch additionally includes an n-channel MOSFET 573, an n-channel MOSFET 574, a p-channel MOSFET 575, an n-channel MOSFET 673, an n-channel MOSFET 674, a p-channel MOSFET 675 and an impedance 600, connected as shown. For example, impedance 600 has a resistance of 100 ohms.

Figure 9:
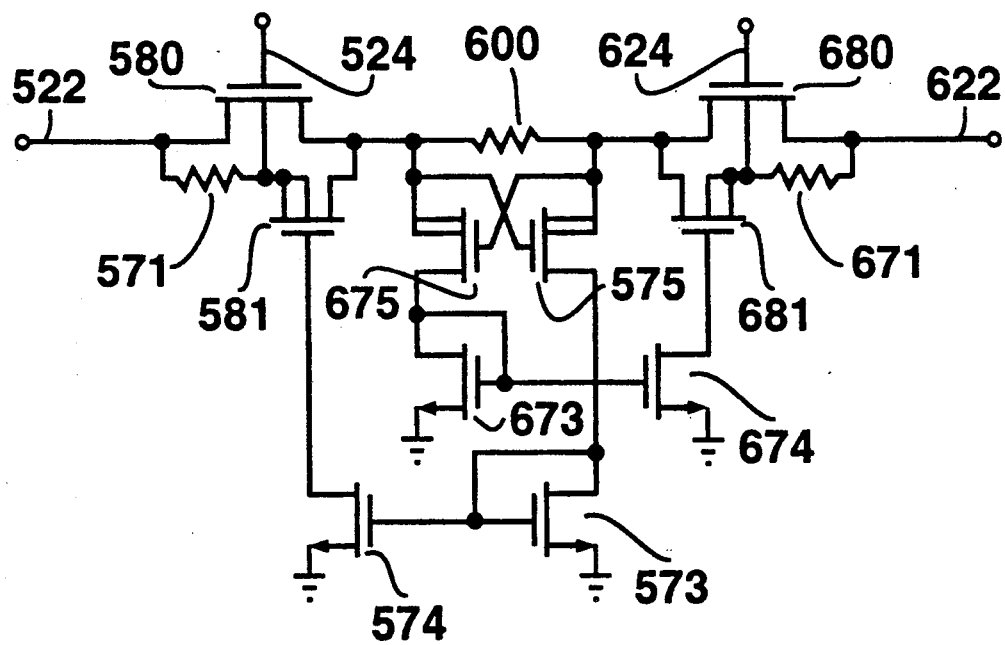
FIG. 9 shows a schematic diagram for the bi-directional MOSFET switch shown in FIG. 8, in accordance with the alternate preferred embodiment of the present invention.

FIG. 9 shows a schematic equivalent of the bi-directional switch shown in FIG. 8. In the schematic equivalent, a MOSFET 580 represents the MOSFET shown in FIG. 8 which is controlled by gate electrode 524. A MOSFET 581 represents the MOSFET shown in FIG. 8 which is controlled by gate region 521. A MOSFET 680 represents the MOSFET shown in FIG. 8 which is controlled by gate electrode 624. A MOSFET 681 represents the MOSFET shown in FIG. 8 which is controlled by gate region 621.

For the circuit shown in FIG. 9, impedance 600 is placed between the drains and the developed voltage drop is used to turn on p-channel MOSFETs 581 and 681 in the equivalent circuits. This is accomplished by adding MOSFETs 575 and 675 that, depending on the polarity of the voltage drop across the impedance block, turn on one of the n-channel current mirror MOSFETs 573 and 574 or MOSFETs 673 and 674. The current mirror provides the gate drive for MOSFET 581 or MOSFET 681.

The various preferred embodiments of the present invention include the above-described bi-directional switches which prevent body diode conduction in the on-state and also prevent a floating condition in the well. Although only one bi-directional switch is shown for each embodiment, several bi-directional switches may be integrated with other control circuit elements on a single substrate. Additionally, the examples given above are for p-channel devices. However, an n-channel bi-directional switch can be also implemented using the reverse conduction type construction.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A bi-directional switch comprising:
   an area of first conductivity type within a substrate;
   a first contact region of second conductivity type within the area;
   a second contact region of second conductivity type within the area;
   a drift region of second conductivity placed within the area and between the first contact region and the second contact region, the drift region being separated from the first contact region by a first channel region within the area and the drift region being separated from the second contact region by a second channel region within the area;
   a first gate region over the first channel region;
   a second gate region over the second channel region,
   a third contact region of second conductivity type within the area, the third contact region being separated from the first contact region by a third channel region within the area;
   a fourth contact region of second conductivity type within the area, the fourth contact region being separated from the second contact region by a fourth channel region within the area;
   a fifth contact region of first conductivity type within the area, the fifth contact region being electrically coupled to the third contact region;
   a sixth contact region of first conductivity type within the area, the sixth contact region being electrically coupled to the fourth contact region;
   a third gate region over the third channel region, the third gate region being electrically coupled to the second contact region; and,
   a fourth gate region over the fourth channel region, the fourth gate region being electrically coupled to the first contact region.

2. A bi-directional switch as in claim 1 additionally comprising:

a seventh contact region of second conductivity type within the area, the seventh contact region being electrically coupled to the fifth contact region;

an eighth contact region of second conductivity type within the area, the eighth contact region being electrically coupled to the sixth contact region;

a ninth contact region of second conductivity type within the area, the ninth contact region being separated from the seventh contact region by a fifth channel region within the area and the ninth contact region being electrically coupled to the first contact region;

a tenth contact region of second conductivity type within the area, the tenth contact region being separated from the eighth contact region by a sixth channel region within the area and the tenth contact region being electrically coupled to the second contact region;

a fifth gate region over the fifth channel region; and, a sixth gate region over the sixth channel region.

3. A bi-directional switch as in claim 2 additionally comprising:

an insulation region placed over the drift region, the first gate region and the second gate region extending over the insulation region.

4. A bi-directional switch as in claim 3 where the drift region is doped at a density of less than $10^{13}$ atoms per square centimeter.

5. A bi-directional switch as in claim 4 wherein a threshold voltage for a transistor gated by the first gate region is less than 1.5 volts and wherein a threshold voltage for a transistor gated by the second gate region is less than 1.5 volts.

6. A bi-directional switch as in claim 2 wherein placement of the first contact region, the third contact region, the fifth contact region, the first channel region and the third channel region within the area is symmetrical with respect to placement of the second contact region, the fourth contact region, the sixth contact region, the second channel region and the fourth channel region, a fixed point of symmetry residing within the drift region.

7. A bi-directional switch as in claim 9 additionally comprising:

a first switch having
  a first switch contact electrically coupled to the first contact region;
  a second switch contact electrically coupled to the sixth gate region; and, a second switch having
  a first switch contact electrically coupled to the fifth gate region;
  a second switch contact electrically coupled to the second contact region.

8. A bi-directional switch as in claim 7 wherein the first switch includes
  a first switch gate region electrically coupled to the first gate region, and
  a second switch gate region electrically coupled to the second gate region; and,
wherein the second switch includes
  a first switch gate region electrically coupled to the first gate region, and
  a second switch gate region electrically coupled to the second gate region.

9. A bi-directional switch comprising:
a first electrode;
a second electrode;
a first transistor in a first well, the first transistor having a first gate, a first source and a first drain;
a second transistor in the first well, the second transistor having a second gate, a second source and a second drain, the second gate being coupled to the first electrode, the second source being electrically coupled to the first well and the second drain being coupled to the first drain;
a first resistor electrically coupled between the first electrode and the first source;
a second resistor electrically coupled between the first source and a first location in the first well;
a third transistor in a second well, the third transistor having a third gate, a third source and a third drain, the third drain being electrically coupled to the first drain;
a fourth transistor in the second well, the fourth transistor having a fourth gate, a fourth source and a fourth drain, the fourth gate being coupled to the second electrode, the fourth source being electrically coupled to the second well and the fourth drain being coupled to the third drain;
a third resistor electrically coupled between the second electrode and the third source; and,
a fourth resistor coupled between the third source and a first location in the second well.

10. A bi-directional switch comprising:
a first electrode;
a second electrode;
a first transistor in a first well, the first transistor having a first gate, a first source and a first drain, the first source being electrically coupled to the first electrode;
a second transistor in the first well, the second transistor having a second gate, a second source and a second drain, the second source being electrically coupled to the first well and the second drain being coupled to the first drain;
a first resistor electrically coupled between the first electrode and a first location in the first well;
a third transistor in a second well, the third transistor having a third gate, a third source and a third drain, the third source being electrically connected to the second electrode;
a fourth transistor in the second well, the fourth transistor having a fourth gate, a fourth source and a fourth drain, the fourth source being electrically coupled to the second well and the fourth drain being coupled to the third drain;
a second resistor coupled between the second electrode and a first location in the second well; and,
a third resistor coupled between the first drain and the third drain;
a fifth transistor having a fifth gate, a fifth source and a fifth drain, the fifth gate being electrically coupled to the third drain and the fifth source being electrically coupled to the first drain;
a sixth transistor having a sixth gate, a sixth source and a sixth drain, the sixth gate being electrically coupled to the fifth drain, the sixth drain being electrically coupled to the fifth drain and the sixth source being electrically coupled to a reference voltage;
a seventh transistor having a seventh gate, a seventh source and a seventh drain, the seventh gate being electrically coupled to the sixth gate, the seventh drain being coupled to the fourth gate and the seventh source being electrically coupled to the reference voltage;

an eighth transistor having an eighth gate, an eighth source and an eighth drain, the eighth gate being electrically coupled to the first drain and the eighth source being electrically coupled to the third drain;

a ninth transistor having a ninth gate, a ninth source and a ninth drain, the ninth gate being electrically coupled to the eighth drain, the ninth drain being electrically coupled to the eighth drain and the ninth source being electrically coupled to the reference voltage; and, a tenth transistor having a tenth gate, a tenth source and a tenth drain, the tenth gate being electrically coupled to the ninth gate, the tenth drain being electrically coupled to the second gate and the tenth source being electrically coupled to the reference voltage.

* * * * *